United States Patent
Chen et al.

(10) Patent No.: US 7,884,653 B2
(45) Date of Patent: Feb. 8, 2011

(54) SOURCE DRIVER WITH CHARGE SHARING

(75) Inventors: Chao-An Chen, Taipei (TW); Kuang-Feng Sung, Taichung County (TW)

(73) Assignee: NOVATEK Microelectronics Corp., Hsinchu Scirnce Park, Hsin-Chu (TW)

( * ) Notice: Subject to any disclaimer, the term of this patent is extended or adjusted under 35 U.S.C. 154(b) by 797 days.

(21) Appl. No.: 11/866,407

(22) Filed: Oct. 2, 2007

(65) Prior Publication Data

US 2009/0015297 A1 Jan. 15, 2009

(30) Foreign Application Priority Data

Jul. 11, 2007 (TW) .............................. 96125236 A (51) Int. Cl.
*H03K 3/00* (2006.01)
(52) U.S. Cl. ........................ 327/108; 345/208; 345/55; 345/82
(58) Field of Classification Search ................. None
See application file for complete search history.

(56) References Cited

U.S. PATENT DOCUMENTS 6,486,715 B2 * 11/2002 Gongwer et al. ............ 327/111

* cited by examiner

*Primary Examiner*—Bipin Shalwala
*Assistant Examiner*—Kelly Hegarty
(74) *Attorney, Agent, or Firm*—Winston Hsu; Scott Margo (57) ABSTRACT

A source driver includes four output switches, two resistors, and a charge-sharing switch. The first output switch and the first resistor are coupled in series to a first output channel of the source driver. The second output switch and the second resistor are coupled in series to a second output channel of the source driver. The third output switch is coupled in parallel to the first output switch. The fourth output switch is coupled in parallel to the second output switch. The charge-sharing switch is coupled between the first resistor and the second resistor. The third output switch and the fourth output switch are controlled to adjust the resistance of the output current path of the source driver.

14 Claims, 8 Drawing Sheets

FIG. 8

SOURCE DRIVER WITH CHARGE SHARING

BACKGROUND OF THE INVENTION

1. Field of the Invention

The present invention relates to a source driver, and more particularly, to a source driver with high driving ability, high stability and high charge-sharing efficiency.

2. Description of the Prior Art

Figure 1:
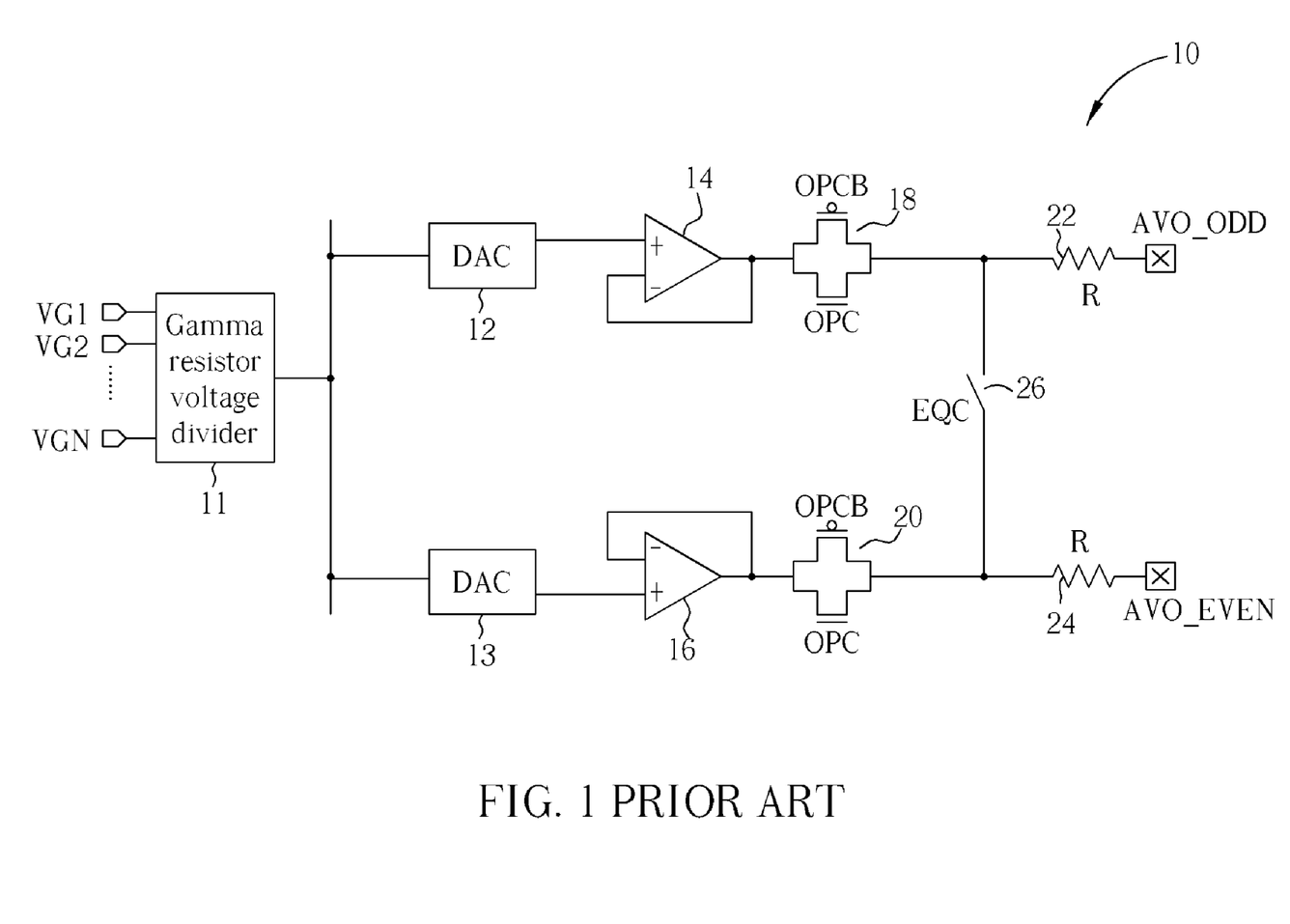
FIG. 1 is a schematic diagram of a source driver according to the prior art.

Please refer to FIG. 1. FIG. 1 is a schematic diagram of a source driver according to the prior art. The source driver 10 comprises a gamma resistor voltage divider 11, a first digital-to-analog converter (DAC) 12, a second DAC 13, a first operational amplifier 14, a second operational amplifier 16, a first output switch 18, a second output switch 20, a first resistor 22, a second resistor 24 and a charge-sharing switch 26. The first output switch 18 and the second output switch 20 are transmission gates respectively controlled by a set of control signals OPC, OPCB, and the charge-sharing switch 26 is controlled by a control signal EQC. The first resistor 22 and the second resistor 24 are electrostatic discharge (ESD) protection resistors, and the resistance of each of the ESD resistors is R.

In General, in order to increase the driving ability of the source driver 10, increasing areas of the first output switch 18 and the second output switch 20 (this means to reduce the equivalent resistances of the output switches 18, 20) or reducing the resistances of the first resistor 22 and the second resistor 24 should be done so as to reduce the resistance between an output current path of the first operational amplifier 14 and the second operational amplifier 16 to a load.

But the resistance also provides a zero point for a system, which is beneficial to the stability of the system. Therefore, it improves the stability of the system to reduce the areas of the first output switch 18 and the second output switch 20 (this means to increase the equivalent resistances of the output switches 18, 20) or increase the resistances of the first resistor 22 and the second resistor 24.

Figure 2:
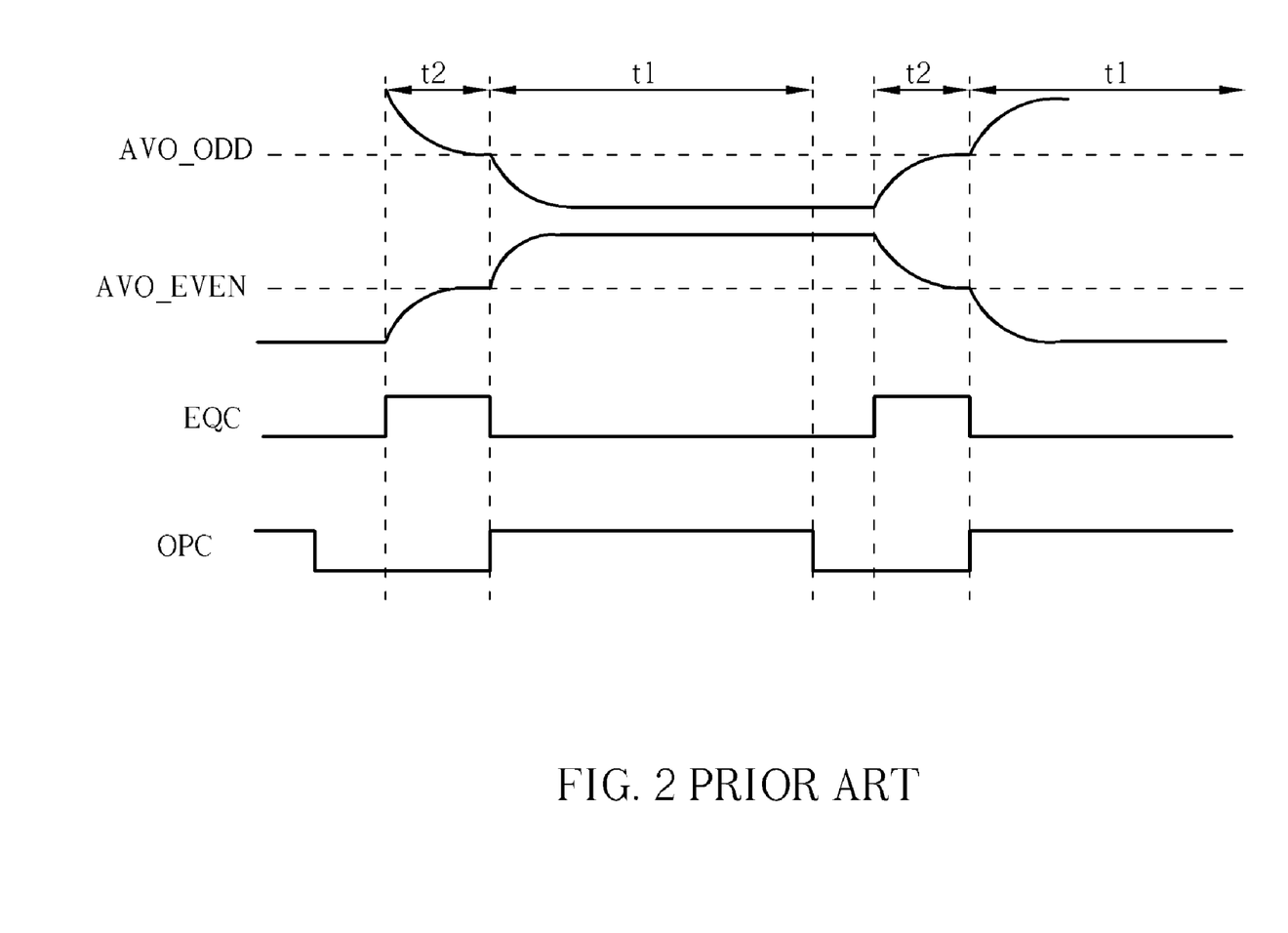
FIG. 2 is an operational waveform diagram of the source driver shown in FIG. 1.

Please refer to both FIG. 1 and FIG. 2. FIG. 2 is an operational waveform diagram of the source driver shown in FIG. 1. Because the liquid crystal cannot stay in a fixed electric potential too long, the liquid crystal requires reversing. In addition, one of a first output channel AVO_ODD and a second output channel AVO_EVEN of the source driver 10 must be a positive electric potential, and the other must be a negative electric potential. Therefore, the source driver 10 often performs the charge sharing through the charge-sharing switch 26 after an operation of driving loads so as to save electrical powers.

As shown in FIG. 2, when the control signal OPC is changed from a high level to a low level, the first output switch 18 and the second output switch 20 are turned off, so the resistance of the source driver 10 for the load end is high. At this time, the gamma resistor voltage divider 11 transmits data of a desired level respectively to the first DAC 12 and the second DAC 13.

Next, when the control signal EQC is changed to the high level, the charge-sharing switch 26 is turned on, and the system enters into the charge-sharing timing t2. At this time, the electric charges at the load end are redistributed through the charge-sharing switch 26, so that the electric potential of the first output channel AVO_ODD and the second output channel AVO_EVEN of the source driver 10 can reach an intermediate value.

Then, the control signal EQC is changed from the high level to the low level, and the charge-sharing switch 26 is turned off. Therefore, the charge-sharing timing t2 ends. At this time, the control signal OPC is also changed from the low level to the high level, and the first output switch 18 and the second output switch 20 are therefore turned on so as to make the system enter an output timing t1. Assume the first output channel AVO_ODD of the source driver 10 is required to reach a negative electric potential, and the second output channel AVO_EVEN is required to reach a positive electric potential, a buffer made up of the first DAC 12 through the first operational amplifier 14 outputs the negative electric potential to the first output channel AVO_ODD, and a buffer made up of the second DAC 13 through the second operational amplifier 16 outputs the positive electric potential to the second output channel AVO_EVEN.

Please note that the resistances of the first resistor 22 and the second resistor 24 affect the efficiency of charge sharing during the charge-sharing timing t2. When the resistances of the first resistor 22 and the second resistor 24 are larger, the time taken by the electric potential of the first output channel AVO_ODD and the second output channel AVO_EVEN of the source driver 10 to reach the intermediate value is longer (it means the time spent for charge-sharing is getting longer), so the efficiency of the charge sharing is lower. During the output timing t1, the resistances of the first resistor 22 and the second resistor 22 limit the driving ability of the source driver 10. In addition, when the resistances of the first resistor 22 and the second resistor 24 are larger, the time taken by the electric potential of the first output channel AVO_ODD and the second output channel AVO_EVEN of the source driver 10 to reach the final value is longer. However, assume the resistances of the equivalent resistor of the output switch and the ESD protection resistor are reduced, the driving ability and the efficiency of the charge sharing of the source driver can be improved, but the stability of the system also becomes worse.

SUMMARY OF THE INVENTION

It is therefore an object to provide a source driver with high stability and high driving ability to improve the problem in the prior art.

According to the claimed invention, a source driver with charge sharing is provided. The source driver comprises a first operational amplifier, an output end of the first operational amplifier coupled to a negative input end of the first operational amplifier; a second operational amplifier, an output end of the second operational amplifier coupled to a negative input end of the second operational amplifier; a first switch, a first end of the first switch coupled to the output end of the first operational amplifier; a first resistor, a first end of the first resistor coupled to a second end of the first switch, and a second end of the first resistor coupled to a first data line; a second switch, a first end of the second switch coupled to the output end of the second operational amplifier; a second resistor, a first end of the second resistor coupled to a second end of the second switch, and a second end of the second resistor coupled to a second data line; a third switch coupled in parallel to the first switch; a third resistor coupled in parallel to the first resistor; a fourth switch coupled in parallel to the second switch; a fourth resistor coupled in parallel to the second resistor; and a fifth switch, a first end of the fifth switch coupled to the first end of the first resistor, and a second end of the fifth switch coupled to the first end of the second resistor.

According to the claimed invention, a source driver with charge sharing is further provided. The source driver comprises a first operational amplifier, an output end of the first operational amplifier coupled to a negative input end of the first operational amplifier; a second operational amplifier, an output end of the second operational amplifier coupled to a negative input end of the second operational amplifier; a first switch, a first end of the first switch coupled to the output end of the first operational amplifier; a first resistor, a first end of the first resistor coupled to a second end of the first switch, and a second end of the first resistor coupled to a first data line; a second switch, a first end of the second switch coupled to the output end of the second operational amplifier; a second resistor, a first end of the second resistor coupled to a second end of the second switch, and a second end of the second resistor coupled to a second data line; a third switch, a first end of the third switch coupled to the first end of the first switch; a third resistor, a first end of the third resistor coupled to a second end of the third switch, and a second end of the third resistor coupled to the second end of the first resistor; a fourth switch, a first end of the fourth switch coupled to the first end of the second switch; a fourth resistor, a first end of the fourth resistor coupled to a second end of the fourth switch, and a second end of the fourth resistor coupled to the second end of the second resistor; and a fifth switch, a first end of the fifth switch coupled to the first end of the first resistor, and a second end of the fifth switch coupled to the first end of the second resistor.

According to the claimed invention, a source driver with charge sharing is further provided. The source driver comprises a first operational amplifier, an output end of the first operational amplifier coupled to a negative input end of the first operational amplifier; a second operational amplifier, an output end of the second operational amplifier coupled to a negative input end of the second operational amplifier; a first switch, a first end of the first switch coupled to the output end of the first operational amplifier; a first resistor, a first end of the first resistor coupled to a second end of the first switch, and a second end of the first resistor coupled to a first data line; a second switch, a first end of the second switch coupled to the output end of the second operational amplifier; a second resistor, a first end of the second resistor coupled to a second end of the second switch, and a second end of the second resistor coupled to a second data line; a third switch coupled in parallel to the first switch; a fourth switch coupled in parallel to the second switch; and a fifth switch, a first end of the fifth switch coupled to the first end of the first resistor, and a second end of the fifth switch coupled to the first end of the second resistor.

According to the claimed invention, a source driver with charge sharing is further provided. The source driver comprises an output buffer for outputting a driving signal; a first current path coupled between the output buffer and a data line; and a second current path coupled in parallel to the first current path; wherein during a first driving period, the output buffer utilizes both the first current path and the second current path to drive the data line; and during a second driving period, the output buffer utilizes only the first current path to transmit the driving signal so as to improve the stability of the source driver.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
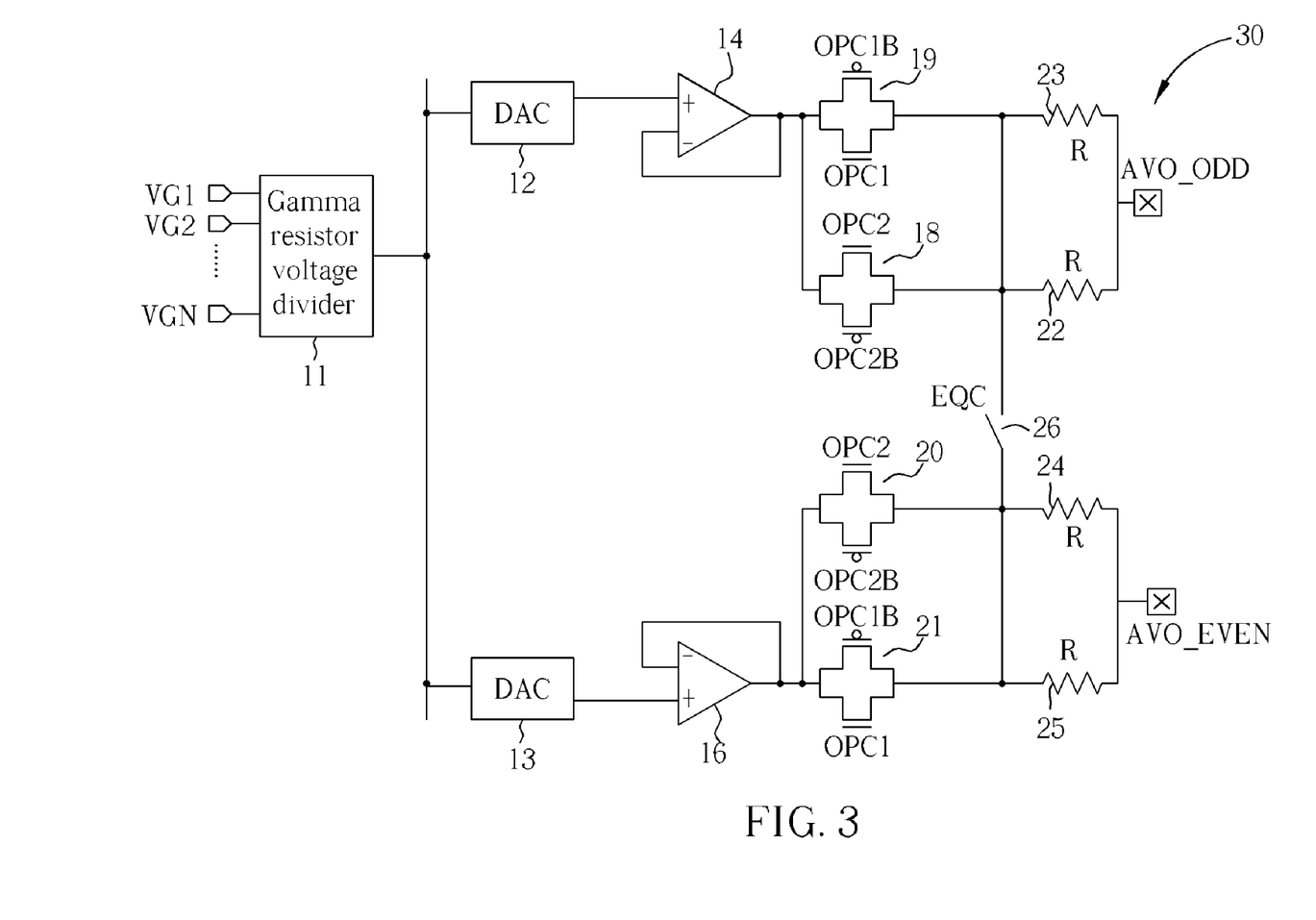
FIG. 3 is a schematic diagram illustrating a source driver according to a first embodiment of the present invention.

Please refer to FIG. 3. FIG. 3 is a schematic diagram illustrating a source driver according to a first embodiment of the present invention. The source driver 30 comprises a gamma resistor voltage divider 11, a digital-to-analog converter (DAC) 12, a second DAC 13, a first operational amplifier 14, a second operational amplifier 16, a first output switch 18, a second output switch 20, a third output switch 19, a fourth output switch 21, a first resistor 22, a second resistor 24, a third resistor 23, a fourth resistor 25 and a charge-sharing switch 26.

Furthermore, the first output switch 18 and the second output switch 20 are controlled by a set of control signals OPC2, OPC2B. The third output switch 19 and the fourth output switch 21 are controlled by a set of control signals OPC1, OPC1B. The charge-sharing switch 26 is controlled by a control signal EQC. The first output switch 18, the second output switch 20, the third output switch 19 and the fourth output switch 21 are transmission gates. The first resistor 22, the second resistor 24, the third resistor 23 and the fourth resistor 25 are electrostatic discharge (ESD) protection resistors. The third output switch 19 is coupled in parallel to the first output switch 18, and the third resistor 23 is coupled in parallel to the first resistor 22. The fourth output switch 21 is coupled in parallel to the second output switch 20, and the fourth resistor 25 is coupled in parallel to the second resistor 24. Therefore, the first output channel AVO_ODD and the second output channel AVO_EVEN of the source driver 30 respectively increase a set of current paths.

Assume the resistances of the first resistor 22, the second resistor 24, the third resistor 23 and the fourth resistor 25 are respectively R, and the equivalent resistances of first output switch 18, the second output switch 20, the third output switch 19 and the fourth output switch 21 are respectively r, the resistance between the first output channel AVO_ODD to the first operational amplifier 14 is (r+R)/2, and the resistance between the second output channel AVO_EVEN to the second operational amplifier 16 is (r+R)/2. That is, the current outputted by the first output channel AVO_ODD is twice as large as the one without the third output switch 19 and the third resistor 23. The current outputted by the second output channel AVO_EVEN is twice as large as the one without the fourth output switch 21 and the fourth resistor 25.

Figure 4:
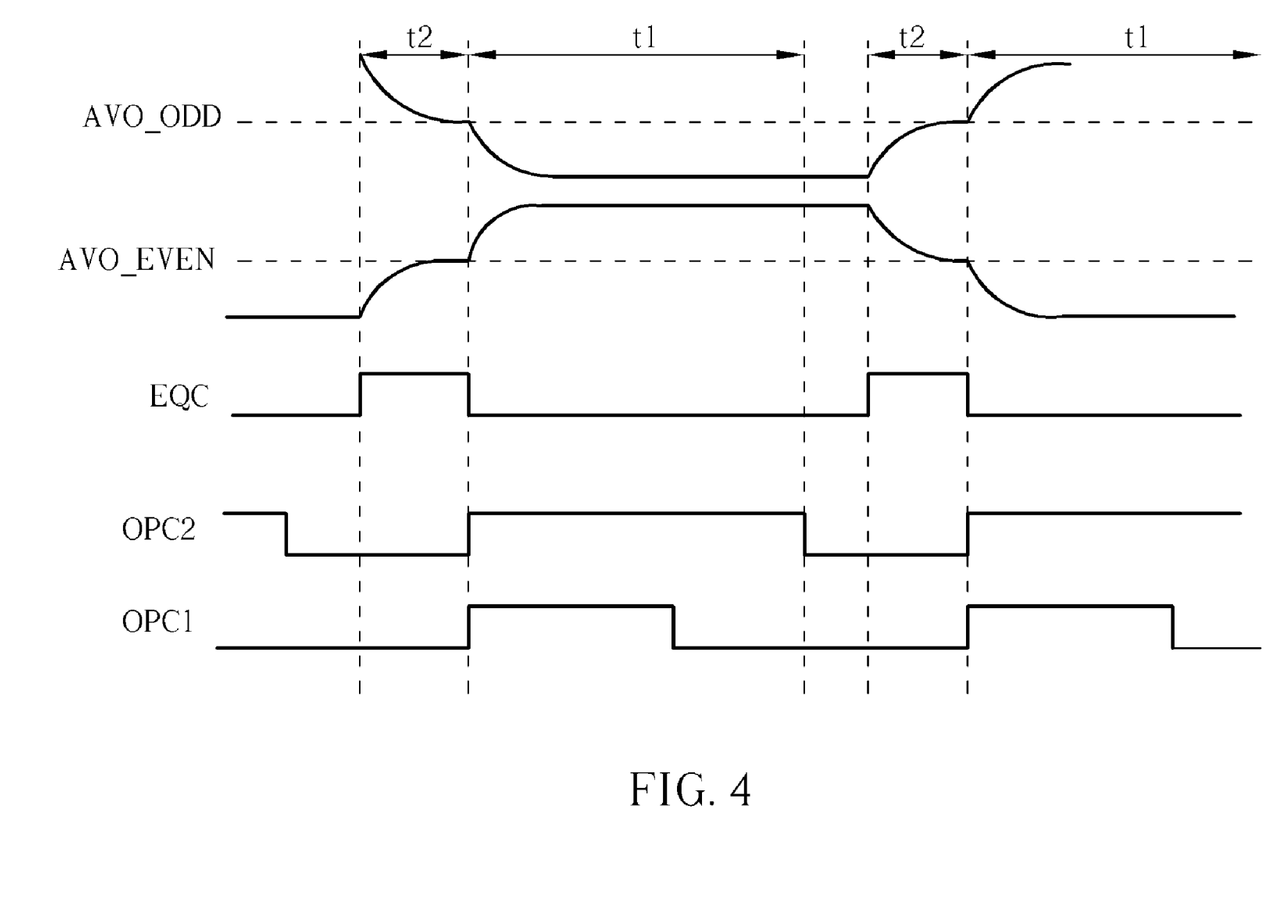
FIG. 4 is an operational waveform diagram of the source driver shown in FIG. 3.

Please refer to FIG. 4. FIG. 4 is an operational waveform diagram of the source driver shown in FIG. 3. When the control signal OPC2 is changed from a high level to a low level, the first output switch 18 and the second output switch 20 are turned off, so the resistance of the source driver 30 for the load end is high. At this time, the gamma resistor voltage divider 11 transmits data of the desired level respectively to the first DAC 12 and the second DAC 13.

Next, the control signal EQC is changed to the high level, and the charge-sharing switch 26 is turned on. This means the system enters the charge-sharing timing t2. At this time, the electric charges in the first output channel AVO_ODD and the second output channel AVO_EVEN of the source driver 30 are redistributed through the path of the charge-sharing switch 26, so that the electric potential can reach an intermediate value. The resistance of the charge-sharing path is R, and the charge-sharing current is twice as large as the one without the third resistor 23 and the fourth resistor 25.

Then, the control signal EQC is changed from the high level to the low level, and the charge-sharing switch 26 is turned off, and the charge-sharing timing t2 ends. At this time, control signal OPC2 is changed from the low level to high level, and the first output switch 18 and the second output switch 20 are turned on so as to make the system enter the output timing t1. At the same time, the control signal OPC1 is also changed from the low level to the high level, and the third output switch 19 and the fourth output switch 21 are turned on. Therefore, the first output channel AVO_ODD and the second output channel AVO_EVEN are equivalent to two current paths that respectively charge the load, and the resistance of the current path is (r+R)/2. After a period of time, the control signal OPC1 is changed from the high level to the low level, and the third switch 19 and the fourth switch 21 are turned off. At this time, the resistance on the charging path is changed to r+(R/2), so that the stability of the system can be maintained.

Hence, by utilizing the aforementioned structure (the third output switch 19 coupled in parallel to a first output switch 18, the third resistor 23 coupled in parallel to the first resistor 22, the fourth output switch 21 coupled in parallel to the second output switch 20, the fourth resistor 25 coupled in parallel to the second resistor 24), the present invention can provide several current paths to the source driver 30 so as to allow the source driver 30 to dynamically use these current paths under different conditions. As a consequence of this, the source driver 30 also satisfies the requirement of the stability of the system besides having better ability to drive the load and better efficiency of charge sharing.

For example, for the data line AVO_ODD (operational amplifier 14), the switch 19 can be regarded as a current path, and the switch 18 can be regarded as another current path. While driving the data line, the present invention utilizes both of the two current paths to transmit the driving signal outputted by the operational amplifier 14. At this time, the two current paths are in parallel, so the equivalent resistance of the transmission path is reduced so as to increase the driving current and the driving ability of the operational amplifier 14. And then, the present invention turns off one of the current paths (switch 19 for example) and only utilizes one current path to transmit the driving signal. Because the equivalent resistance of single current path is larger, a better zero point can be provided for the system so as to improve the stability of the system.

Figure 5:
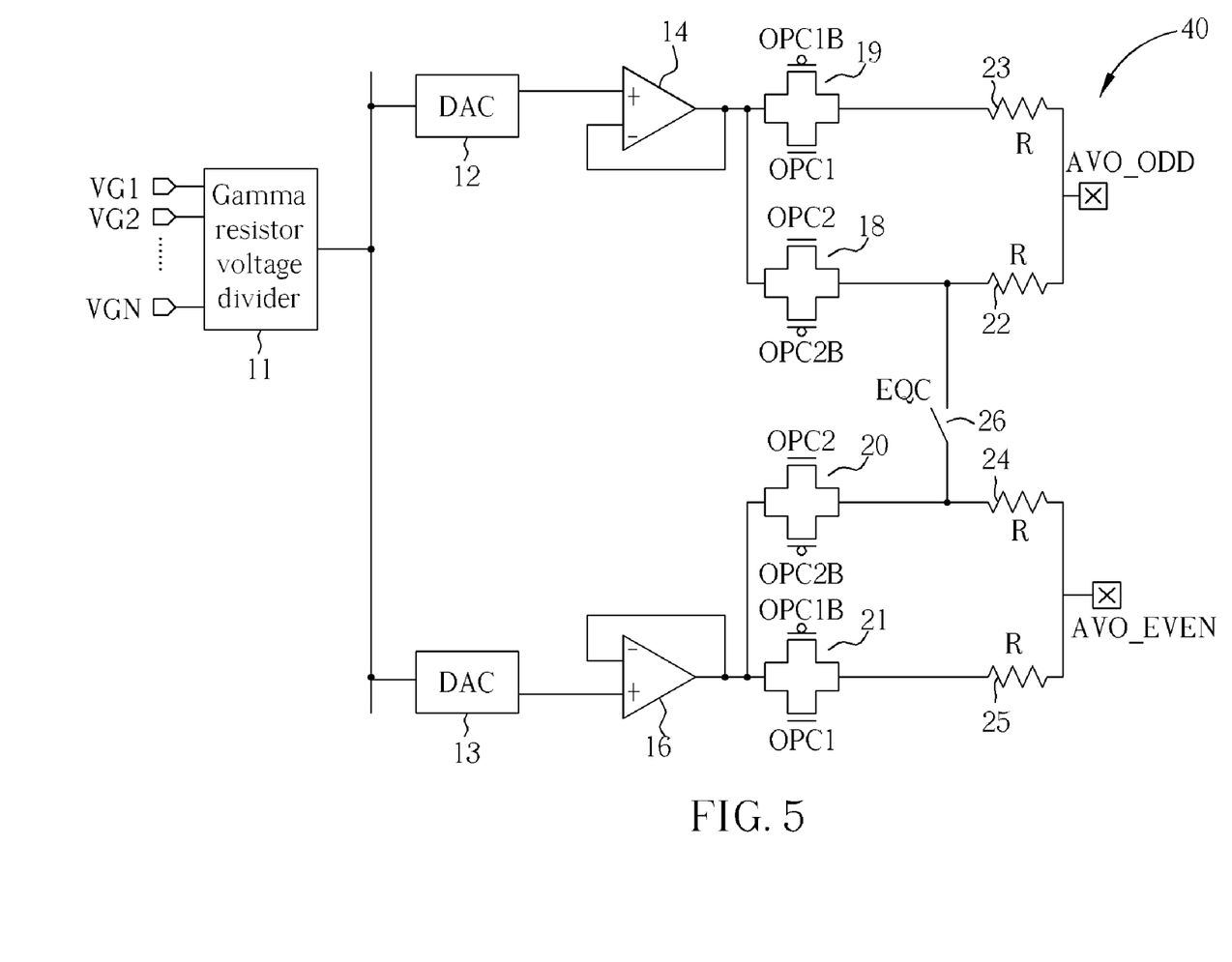
FIG. 5 is a schematic diagram illustrating a source driver according to a second embodiment of the present invention.

Please refer to FIG. 5. FIG. 5 is a schematic diagram illustrating a source driver according to a second embodiment of the present invention. In the second embodiment, the connections among the third output switch 19, the third resistor 23, the fourth output switch 21 and the fourth resistor 25 of the source driver 40 is different from the first embodiment. The third output switch 19 and third resistor 23 coupled in series are coupled in parallel to the first output switch 18 and the first resistor 22 coupled in series so as to form two current paths between the first operational amplifier 14 to the first output channel AVO_ODD, and the resistance thereof is (r+R)/2. Similarly, the fourth output switch 21 and fourth resistor 25 coupled in series are coupled in parallel to the second output switch 20 and the second resistor 24 coupled in series so as to form two current paths between the second operational amplifier 16 to the second output channel AVO_EVEN, and the resistance thereof is (r+R)/2. Therefore, the operational waveform diagram of the source driver 40 is the same as the FIG. 3. After a period of time, the control signal OPC1 is changed from the high level to the low level, and the third output switch 19 and the fourth output switch 21 are turned off. At this time, the resistance of the current path is r+R, so that the stability of the system can be maintained.

However, in operation, the difference between the second embodiment and the first embodiment is when the system performs charge sharing, the switches 18, 19, 20, 21 are turned off, so the first output channel AVO_ODD and the second output channel AVO_EVEN share charges only through the resistor 22 and the resistor 24. This means the equivalent resistance on the charge-sharing path is 2R. Therefore, in this embodiment, although the efficiency of charge sharing is worse than the one of the first embodiment, this embodiment can have better EDS protection ability due to the larger resistance of the charge-sharing path.

Figure 6:
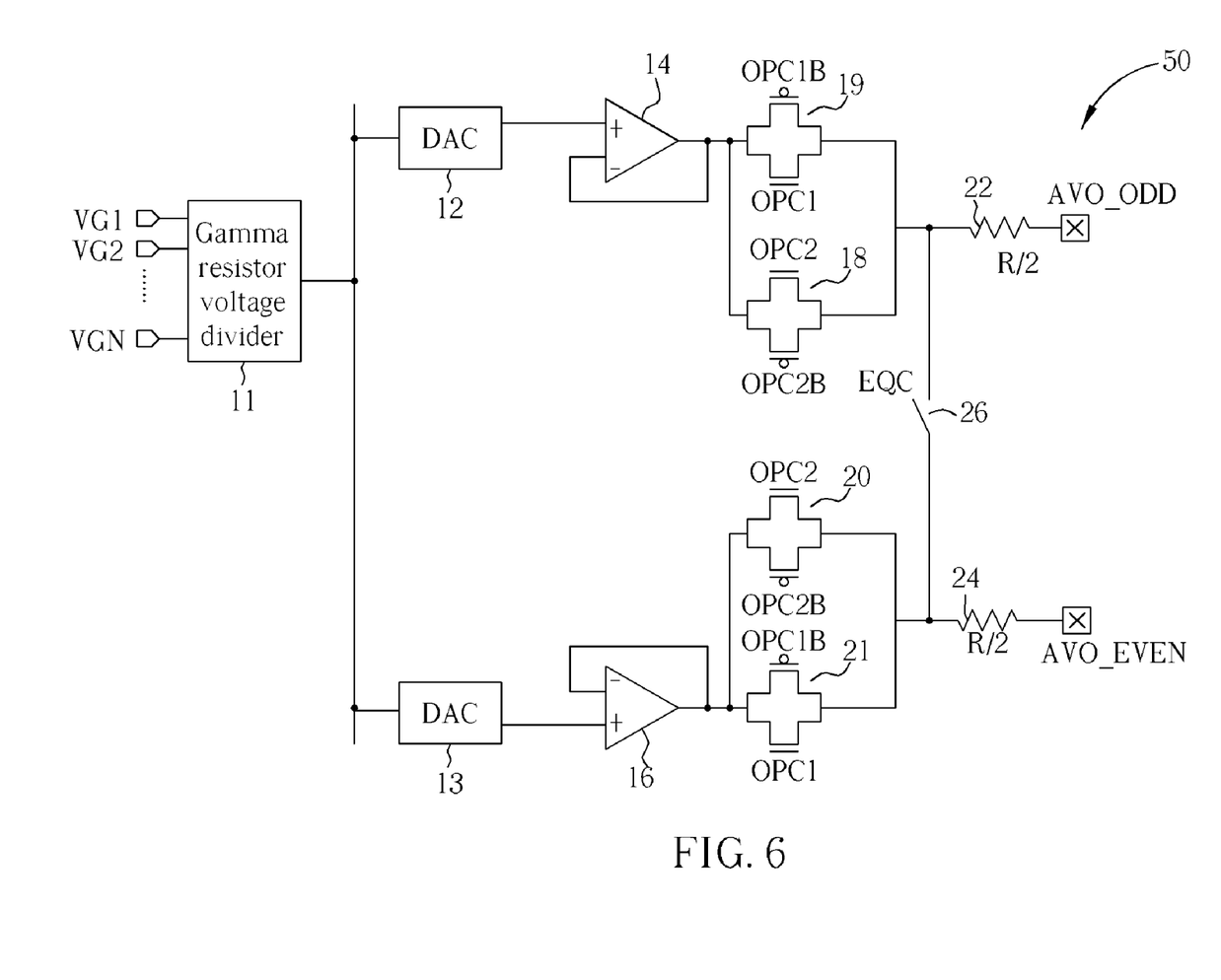
FIG. 6 is a schematic diagram illustrating a source driver according to a third embodiment of the present invention.

Please refer to FIG. 6. FIG. 6 is a schematic diagram illustrating a source driver according to a third embodiment of the present invention. In the third embodiment, the third output switch 19 is coupled in parallel to the first output switch 18, and the fourth output switch 21 is coupled in parallel to the second output switch 20. Therefore, the first output channel AVO_ODD and the second output channel AVO_EVEN of the source driver 50 have an extra current path respectively, and the operational waveform diagram of the source driver 50 is the same as the FIG. 3.

Hence, in this embodiment, when the system performs charge sharing (the switches 18,19,20,21 are turned off at this time), the resistance of the charge-sharing path of the source driver 50 is R. When the system drives the load (the switches 18,19,20,21 are turned on at this time), the resistance between the first output channel AVO_ODD to the first operational amplifier 14 is (r+R)/2, and the resistance between the second output channel AVO_EVEN to the second operational amplifier 16 is (r+R)/2 since the first resistor 22 and the second resistor 24 of the source driver 50 are R/2 respectively. In addition, after a period of time, the control signal OPC1 is changed from the high level to the low level, and the third output switch 19 and the fourth output switch 21 are turned off. At this time, the resistance of the current path is changed from original (r+R)/2 to r+(R/2), so that the stability of the system can be maintained.

Therefore, in this embodiment, the source driver 50 also can have both the ability of driving the load while retaining stability of the system.

Figure 7:
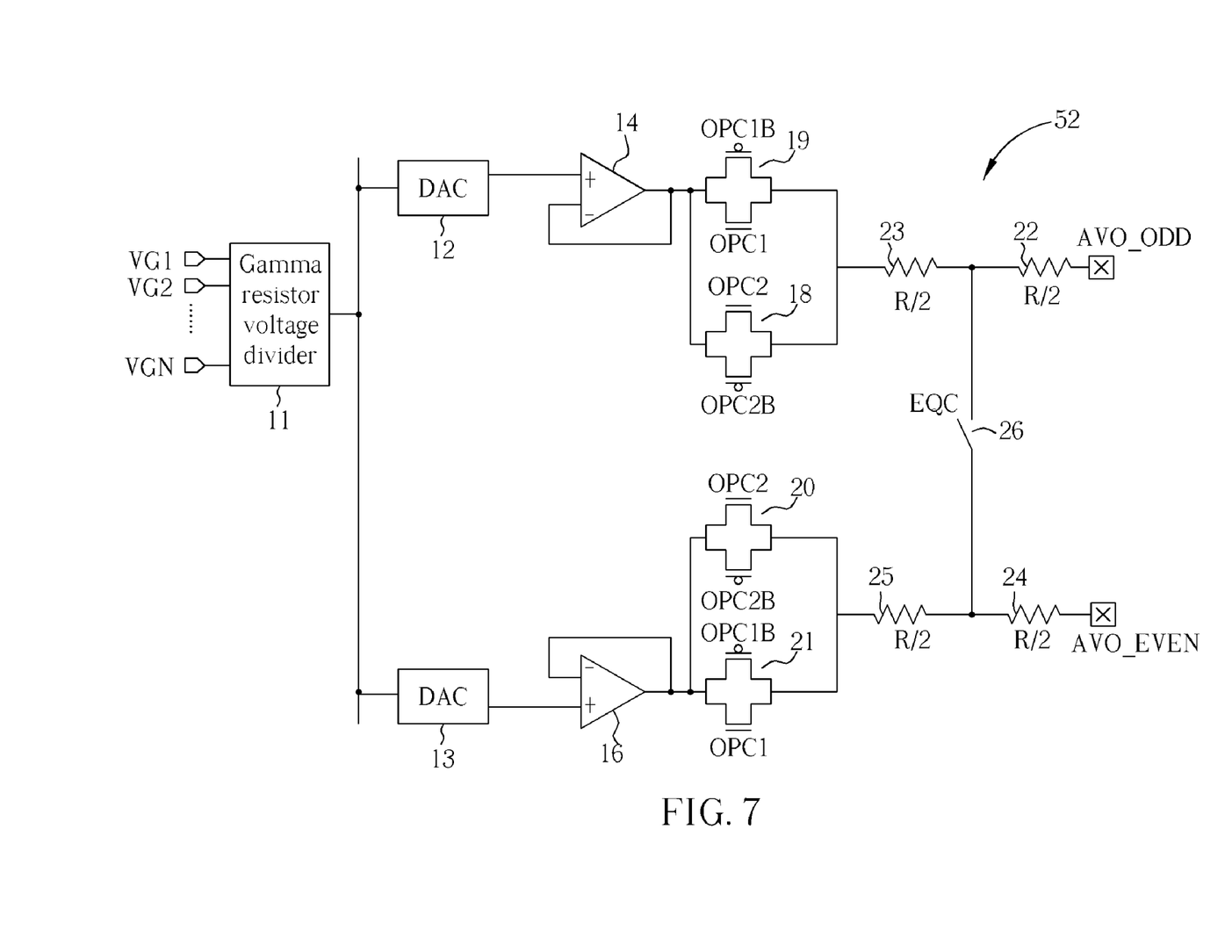
FIG. 7 is a schematic diagram illustrating a source driver according to a fourth embodiment of the present invention.

Please refer to FIG. 7. FIG. 7 is a schematic diagram illustrating a source driver according to a fourth embodiment of the present invention. The fourth embodiment is an extended design of the third embodiment. The resistances of the first resistor 22, the second resistor 24, the third resistor 23 and the fourth resistor 25 of the source driver 52 are respectively R/2. The third resistor 23 is coupled between the first output switch 18 and the first resistor 22, and the fourth resistor 25 is coupled between the second output switch 20 and the second resistor 24.

Therefore, when the system drives the load (the switches 18, 19, 20, 21 are turned on at this time), the resistance between the first output channel AVO_ODD to the first operational amplifier 14 is (r/2)+R, and the resistance between the second output channel AVO_EVEN to the second operational amplifier 16 is (r/2)+R. When the system performs charge sharing (the switches 18, 19, 20, 21 are turned off at this time), the resistance of the charge-sharing path of the source driver 52 is R. In addition, after a period of time, the control signal OPC1 is changed from the high level to the low level, and the third output switch 19 and the fourth output switch 21 are turned off. The resistance of the current path is changed from the original (r/2)+R to r+R, so that the stability of the system can be maintained. Therefore, the source driver 52 can have both the ability of driving the load while retaining stability of the system.

Figure 8:
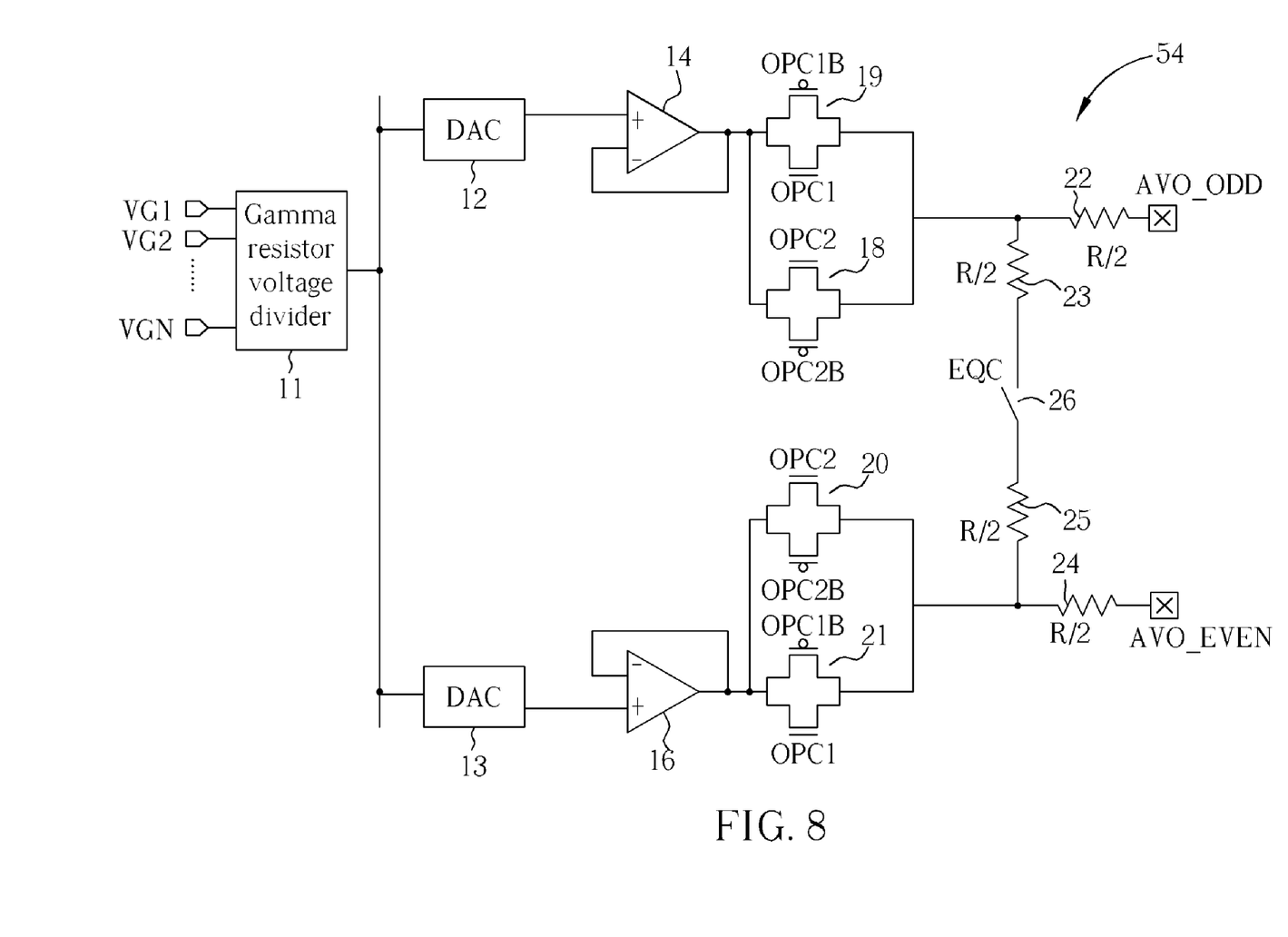
FIG. 8 is a schematic diagram illustrating a source driver according to a fifth embodiment of the present invention.

Please refer to FIG. 8. FIG. 8 is a schematic diagram illustrating a source driver according to a fifth embodiment of the present invention. The fifth embodiment is an extended design of the third embodiment. The resistances of the first resistor 22, the second resistor 24, the third resistor 23 and the fourth resistor 25 of the source driver 52 are R/2 respectively. The third resistor 23 is coupled between the charge-sharing switch 26 and the first resistor 22, and the fourth resistor 25 is coupled between the charge-sharing switch 26 and the second resistor 24.

Similarly, when the system performs charge sharing, the resistance of the charge-sharing path of the source driver 54 is 2R. When the system drives the load (the switches 18,19,20, 21 are turned on at this time), the resistance between the first output channel AVO_ODD to the first operational amplifier 14 is (r+R)/2, and the resistance between the second output channel AVO_EVEN to the second operational amplifier 16 is (r+R)/2. In addition, after a period of time, the control signal OPC1 is changed from the high level to the low level, and the third output switch 19 and the fourth output switch 21 are turned off. At this time, the resistance of the current path is changed from original (r+R)/2 to r+(R/2), so that the stability of the system can be maintained. Therefore, the source driver 54 has better system stability and load-driving efficiency. The resistance between the second output channel AVO_EVEN to the second operational amplifier 16 is (r+R)/2, and the resistance of the charge-sharing path of the source driver 54 is 2R. The source driver 54 can have both the ability of driving the load and while retaining stability of the system.

Please note that the resistance of each of the aforementioned resistors and switches is only utilized to illustrate the present invention, not to limit the present invention. In the actual implementation, circuit designers can design the resistance of each of the resistors and the switches according to their requirements, so that the source driver can have required load-driving ability, stability and charge-sharing efficiency. Such related changes are also included among the present invention.

In conclusion, the source driver of the present invention utilizes two parallel output switches to control the output current, which can improve the driving ability of the source driver and maintain the stability of the system. The first output switch and the first resistor of the source driver are coupled in series to the first output channel of the source driver. The second output switch and the second resistor are coupled in series to the second output channel of the source driver. The third output switch is coupled in parallel to the first output switch, and the fourth output switch is coupled in parallel to the second output switch. The charge-sharing switch is coupled between the first resistor and the second resistor. The third output switch and the fourth output switch are controlled to adjust the resistance of the output current path of the source driver. Therefore, when the source driver is driven, the resistance of the current path is small. When the source driver is required to be stable, the resistance of the current path is large. In addition, the third resistor is coupled in parallel to the first resistor, and the fourth resistor is coupled in parallel to the second resistor so as to reduce the resistance on the charge-sharing path and increase the efficiency of the charge sharing.

Those skilled in the art will readily observe that numerous modifications and alterations of the device and method may be made while retaining the teachings of the invention.

What is claimed is:

1. A source driver with charge sharing, comprising:
   a first operational amplifier, an output end of the first operational amplifier coupled to a negative input end of the first operational amplifier;
   a second operational amplifier, an output end of the second operational amplifier coupled to a negative input end of the second operational amplifier;
   a first switch, a first end of the first switch coupled to the output end of the first operational amplifier;
   a first resistor, a first end of the first resistor coupled to a second end of the first switch, and a second end of the first resistor coupled to a first data line;
   a second switch, a first end of the second switch coupled to the output end of the second operational amplifier;
   a second resistor, a first end of the second resistor coupled to a second end of the second switch, and a second end of the second resistor coupled to a second data line;
   a third switch coupled in parallel to the first switch;
   a third resistor coupled in parallel to the first resistor;
   a fourth switch coupled in parallel to the second switch;
   a fourth resistor coupled in parallel to the second resistor; and
   a fifth switch, a first end of the fifth switch coupled to the first end of the first resistor, and a second end of the fifth switch coupled to the first end of the second resistor.

2. The source driver of claim 1, further comprising:
   a first digital-to-analog converter (DAC) coupled to a positive input end of the first operational amplifier; and
   a second DAC coupled to a positive input end of the second operational amplifier.

3. The source driver of claim 2, further comprising:
   a gamma resistor voltage divider coupled to the first DAC and the second DAC.

4. The source driver of claim 1, wherein the first switch, the second switch, the third switch and the fourth switch are transmission gates.

5. A source driver with charge sharing, comprising:
   a first operational amplifier, an output end of the first operational amplifier coupled to a negative input end of the first operational amplifier;
   a second operational amplifier, an output end of the second operational amplifier coupled to a negative input end of the second operational amplifier;
   a first switch, a first end of the first switch coupled to the output end of the first operational amplifier;
   a first resistor, a first end of the first resistor coupled to a second end of the first switch, and a second end of the first resistor coupled to a first data line;
   a second switch, a first end of the second switch coupled to the output end of the second operational amplifier;
   a second resistor, a first end of the second resistor coupled to a second end of the second switch, and a second end of the second resistor coupled to a second data line;
   a third switch, a first end of the third switch coupled to the first end of the first switch;
   a third resistor, a first end of the third resistor coupled to a second end of the third switch, and a second end of the third resistor coupled to the second end of the first resistor;
   a fourth switch, a first end of the fourth switch coupled to the first end of the second switch;

a fourth resistor, a first end of the fourth resistor coupled to a second end of the fourth switch, and a second end of the fourth resistor coupled to the second end of the second resistor; and a fifth switch, a first end of the fifth switch coupled to the first end of the first resistor, and a second end of the fifth switch coupled to the first end of the second resistor.

6. The source driver of claim 5, further comprising:

a first digital-to-analog converter (DAC) coupled to a positive end of the first operational amplifier; and a second DAC coupled to a positive end of the second operational amplifier.

7. The source driver of claim 6, further comprising:

a gamma resistor voltage divider coupled to the first DAC and the second DAC.

8. The source driver of claim 5, wherein the first switch, the second switch, the third switch and the fourth switch are transmission gates.

9. A source driver with charge sharing, comprising:

a first operational amplifier, an output end of the first operational amplifier coupled to a negative input end of the first operational amplifier;

a second operational amplifier, an output end of the second operational amplifier coupled to a negative input end of the second operational amplifier;

a first switch, a first end of the first switch coupled to the output end of the first operational amplifier;

a first resistor, a first end of the first resistor coupled to a second end of the first switch, and a second end of the first resistor coupled to a first data line;

a second switch, a first end of the second switch coupled to the output end of the second operational amplifier;

a second resistor, a first end of the second resistor coupled to a second end of the second switch, and a second end of the second resistor coupled to a second data line;

a third switch coupled in parallel to the first switch;

a fourth switch coupled in parallel to the second switch; and a fifth switch, a first end of the fifth switch coupled to the first end of the first resistor, and a second end of the fifth switch coupled to the first end of the second resistor.

10. The source driver of claim 9, further comprising:

a third resistor coupled between the second end of the first switch and the first end of the first resistor; and a fourth resistor coupled between the second end of the second switch and the first end of the second resistor.

11. The source driver of claim 9, further comprising:

a third resistor coupled between the first end of the fifth switch and the first end of the first resistor; and a fourth resistor coupled between the second end of the fifth switch and the first end of the second resistor.

12. The source driver of claim 9, further comprising:

a first digital-to-analog converter (DAC) coupled to a positive input end of the first operational amplifier; and a second DAC coupled to a positive input end of the second operational amplifier.

13. The source driver of claim 12, further comprising:

a gamma resistor voltage divider coupled to the first DAC and the second DAC.

14. The source driver of claim 9, wherein the first switch, the second switch, the third switch and the fourth switch are transmission gates.

* * * * *

UNITED STATES PATENT AND TRADEMARK OFFICE
CERTIFICATE OF CORRECTION

PATENT NO. : 7,884,653 B2
APPLICATION NO. : 11/866407
DATED : February 8, 2011
INVENTOR(S) : Chao-An Chen et al.

Page 1 of 1

It is certified that error appears in the above-identified patent and that said Letters Patent is hereby corrected as shown below:

On the title page, item (73), correct the residence of the Assignee from "Hsinchu Scirnce Park" to -- Hsinchu Science Park --.

Signed and Sealed this
Fourteenth Day of June, 2011

David J. Kappos
*Director of the United States Patent and Trademark Office*